United States Patent [19]
Dang et al.

[11] Patent Number: 5,563,409
[45] Date of Patent: Oct. 8, 1996

[54] CROSSTALK MEASUREMENT SYSTEM AND TECHNIQUE

[75] Inventors: Khoa V. Dang, Springfield; Christopher L. Kauffman, Stafford; Zenon I. Derzko, Lorton, all of Va.

[73] Assignee: The United States of America as represented by the Secretary of the Army, Washington, D.C.

[21] Appl. No.: 361,243

[22] Filed: Dec. 21, 1994

[51] Int. Cl.⁶ .................................................... G01D 18/00
[52] U.S. Cl. ................................................................. 250/252.1
[58] Field of Search ............................. 250/252.1 A, 332, 250/370.08

[56] References Cited

U.S. PATENT DOCUMENTS

| | | | |
|---|---|---|---|
| 3,703,669 | 11/1972 | London | 257/461 |
| 4,885,463 | 12/1989 | Wellman et al. | 250/252.1 |
| 4,975,573 | 12/1990 | Girard | 250/252.1 |

*Primary Examiner*—Carolyn E. Fields
*Assistant Examiner*—Edward J. Glick
*Attorney, Agent, or Firm*—Milton W. Lee; Alain L. Bashore; John E. Holford

[57] ABSTRACT

An automated test system and method for infrared focal plane detector arrays which utilize X-Y positioning of a focused laser spot scanning individual detector array elements Detector element outputs are processed for the entire focal plane array resulting in crosstalk measurement.

2 Claims, 4 Drawing Sheets

CROSSTALK MEASUREMENT SYSTEM AND TECHNIQUE

BACKGROUND OF THE INVENTION

1. Field of the Invention

The present invention generally relates to detector efficiency measurement and more specifically, to an infrared focal plane array (FPA) crosstalk measurement system and technique.

2. Description of Prior Art

Crosstalk occurring in a FPA imaging system will degrade the system Modulation Transfer Function (MTF) thereby lowering the overall system performance. Optical crosstalk occurs due to the effects of optical reflections, refractions, scattering, internal and external to the FPA. Electrical crosstalk can be attributed to factors such as the charge transfer inefficient of the charge couple device (CCD), or the incomplete discharge of a detector's integration capacitance. A maximum allowable crosstalk is now specified for all new U.S. Army FPA systems and is an important performance parameter that must be measured.

In the prior art, crosstalk measurement is achieved by using a small aperture blackbody source imaged onto the FPA using an off-axis parabolic collimating mirror coupled with a focussing lens. To measure crosstalk accurately it is essential that the spot size of the radiation source utilized be smaller than the detector size. In order to achieve a small spot size for an incoherent source, relatively expensive large optical elements are needed. The use of an incoherent source has thus led to limitations in crosstalk measurement due to the difficulty of forming a small spot size. While the prior art has reported using an incoherent source with mirror elements for crosstalk measurement none have established a basis for a specific apparatus that is dedicated to the task of resolving the particular problem at hand.

What is needed in this instance is a infrared FPA crosstalk measurement technique and system that utilizes a coherent radiation source.

SUMMARY OF THE INVENTION

It is therefore one object of the invention to provide a infrared FPA crosstalk measurement technique and system that utilizes a coherent radiation source.

According to the invention, there is disclosed a system and technique for the evaluation and characterization of infrared focal plane detector arrays. At least one laser source is adjustably mounted and optically aligned with a cooled focal plane array, where both are mounted on a stable optical platform. The disclosed improvement includes providing X-Y directional translation of the cooled array capable of approximately one micrometer positional increments. The laser beam is expanding and collimated for formation of a laser beam spot focusable onto individual detector elements of the array. The X-Y positioning of detector elements relative to said focused spot is controlled, such that a detector element output for each individual detector element is output. The detector element outputs are processed for the entire infrared focal plane array, such that crosstalk between detector elements is measured.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

A test system and method has been developed by the U.S. Army that is utilized for characterizing all types of infrared and far-infrared detector arrays. This system and method utilizes a number of different sources (including a coherent radiation source) and is highly automated by means of computer control, but is not useable for certain characterizations such as crosstalk measurements. The present invention is an improvement of the above mentioned invention which is the subject of U.S. patent application Ser. No. 08/068,341 entitled "Focal Plane Array Test Facility" to Christopher R. Costanzo et al. filed 28 May 1993, incorporated herein by reference (with common assignee and one common inventor).

Figure 1:
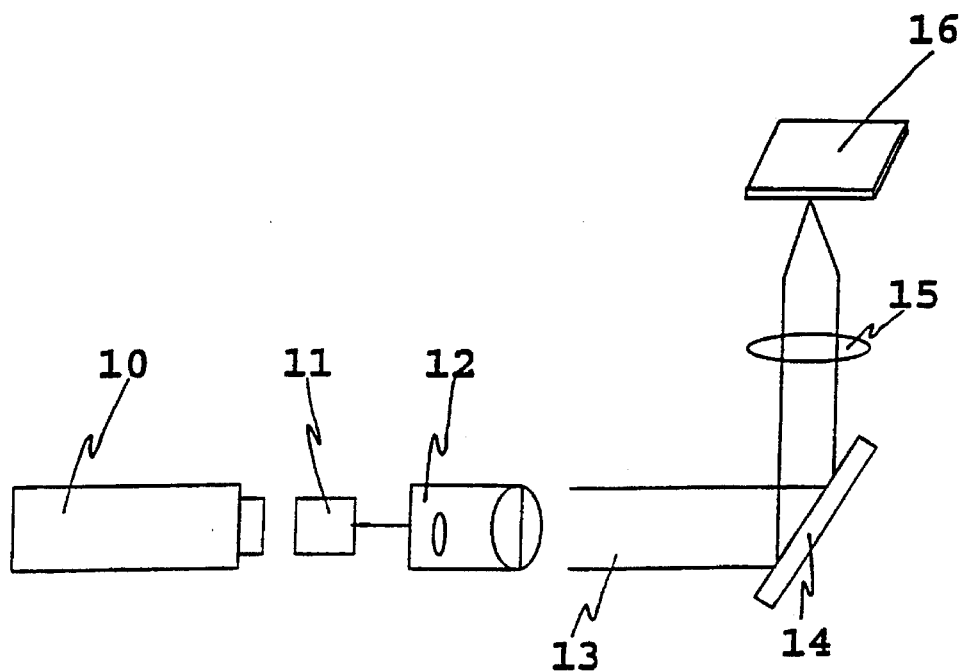
FIG. 1 is a diagram of the optical layout with ray trace utilizing the technique of the present invention.

Referring now to the drawings, and more particularly to FIG. 1, there is shown the optical layout with ray trace utilized in the present invention. Laser 10 is the source of coherent radiation coupled to variable attenuator 11. The laser beam is expanded and collimated within beam expander/collimator 12 shown in FIG. 1 as expanded and collimated beam 13 which exits from beam expander/collimator 12. Expanded and collimated beam 13 is deflected upward by mirror 14 and therethrough focusing optics 15 so that the laser beam is focussed to a spot on FPA 16 housed within a dewar (not shown).

Focusing optics are mounted for computer controlled translation so that automatic control of lens position is achieved resulting in the focus of the spot onto a detector element. Once the spot is focused, the position of the lens remains fixed. To scan the spot across FPA 16, the dewar assembly will be moved in X and Y directions. By moving FPA 16 and keeping focusing optics 15 fixed, the optical characteristics of the spot will remain constant throughout the measurement.

Figure 2:
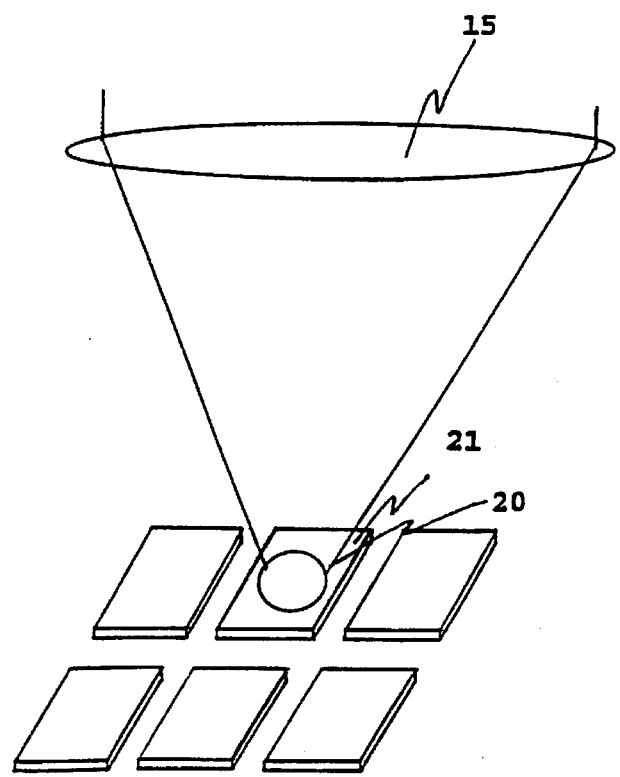
FIG. 2 is a view of the laser spot size relative to individual detector size.

FIG. 2 is a view of the laser spot size 20 relative to individual detector size 21. The general equation for an estimate of the spot size of a coherent beam passing through a focusing lens is:

$$d = (4/\pi) \times \lambda \times (f/D) \quad [1]$$

where d is the spot diameter, $\lambda$ is the wavelength of the coherent radiation source, f is the focal length of the focusing lens, and D is the collimated beam diameter.

To obtain a minimum spot size, the quantity f/D is minimized which is the f-number (f/#) of an optical system. One way to make the f/# smaller is to expand the diameter of the beam. The laser beam profile will be truncated due to physical size limitations on the optical elements. In addition, actual optical system components tend to suffer from some measure of aberrations, distortions, and diffraction effects. All of these imperfections will co-add to reduce the laser beam's axial intensity and the spot diameter will increase by varying amounts, depending on the specific optical configuration. These considerations signify that, in general, the final spot size diameter will be somewhat greater than the approximately 2 times λ prediction given by equation 1 and indicates that spot diameters somewhere between 10 and 30 μm is achievable. A Helium-Neon laser operating at 3.39 μm achieves a minimum focussable diameter of about 10 μm, and for a $CO_2$ laser operating at 10.6 μm the minimum achievable diameter would be approximately 30 μm.

Figure 3:
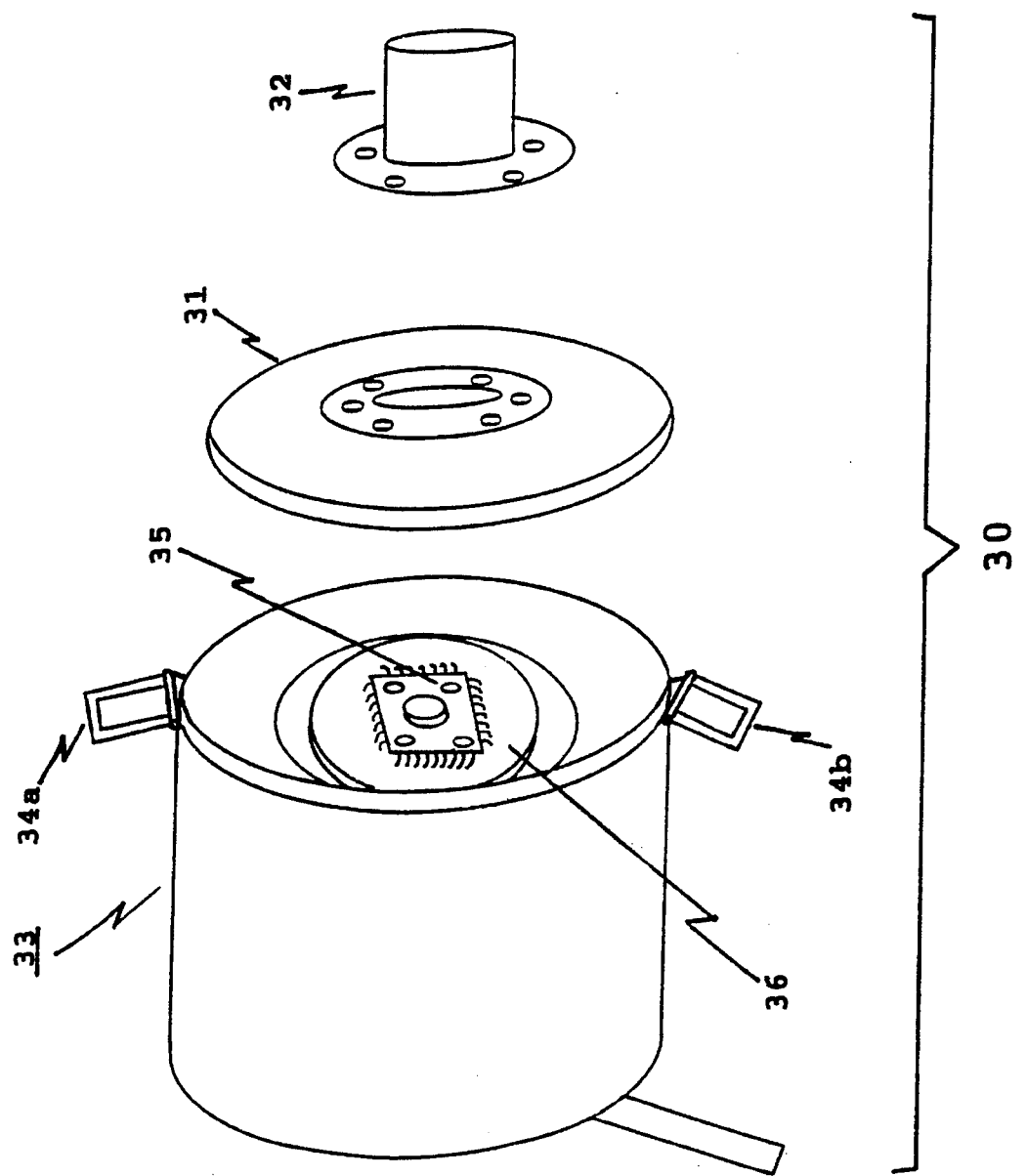
FIG. 3 is an exploded view of the front of the dewar assembly.
Figure 4:
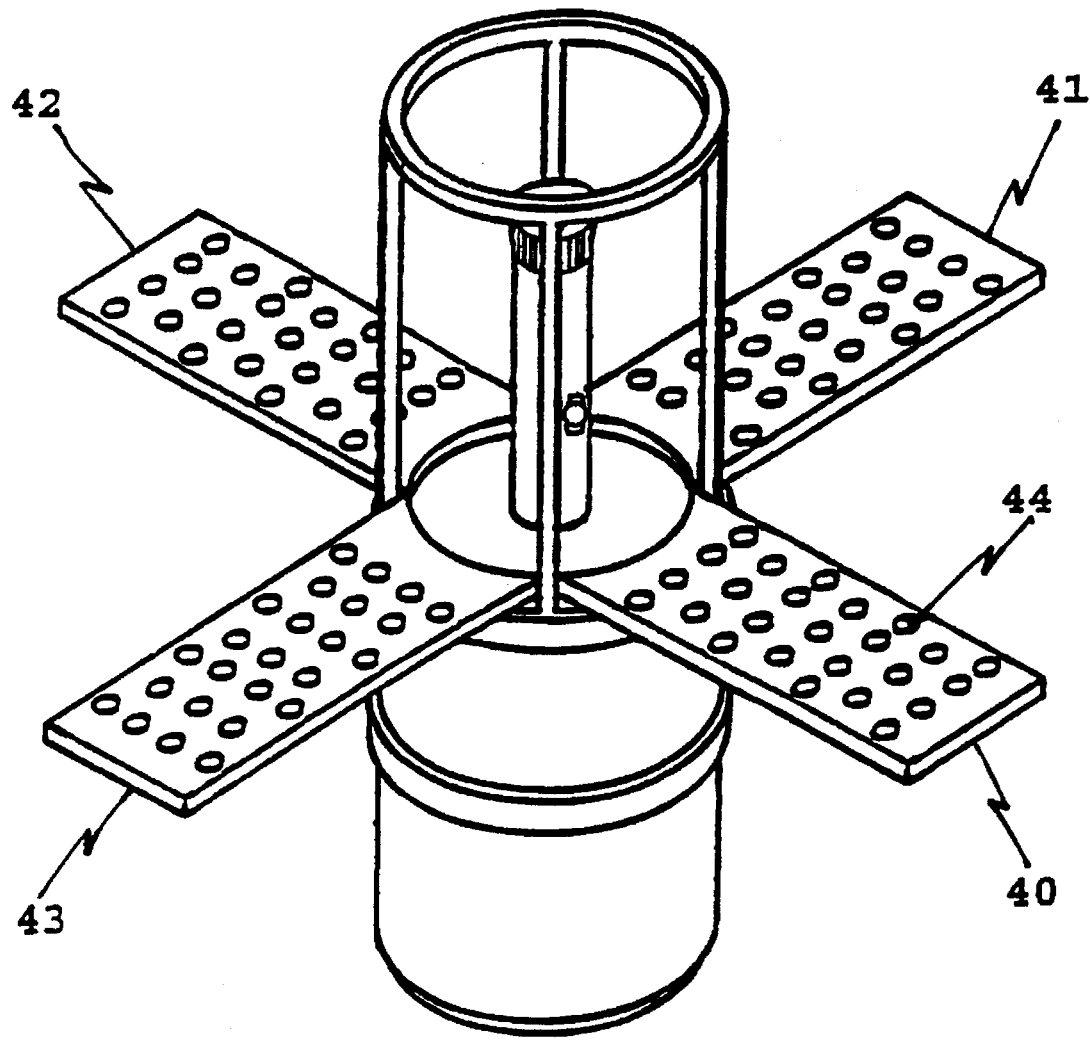
FIG. 4 is a view of the dewar assembly with breakout module attached.

FIG. 3 is an exploded view of the front half of the dewar assembly 30 which includes window cover 31, coldshield 32 and main dewar body 33 with latching means 34a and 34b for releasable latching of window cover 31 to main dewar body 33. The dewar assembly utilized in the present invention is a LakeShore model MTD-150 available from: Lake Shore Cryotronics, INC., Westerville, Ohio. It is understood that any functionally equivalent dewar assembly can be utilized in the present invention to perform a crosstalk measurement. Main dewar body 33 includes within the dewar as shown, a FPA coupled to personality board 35 which functions to hold the FPA in place and allow for electrical connection to the FPA via multi-pin leaderless connections. Personality board 35 is coupled on its back thereto coldfinger end 36, so that cryogenic cooling is performed upon the FPA. FIG. 4 is a view of the full dewar assembly with breakout modules 40 through 43 attached. These modules mount directly to multiple line feedthroughs on the base plate of the vacuum chamber of the dewar as known in the Prior Art. Triax connectors such as connector 44 allow for the electrical connection of individual electrical feedlines of the FPA. It is understood that the dewar assembly is known in the prior art and as such its specific functions are not required to be given in detail for a full understanding of the present invention.

Figure 5:
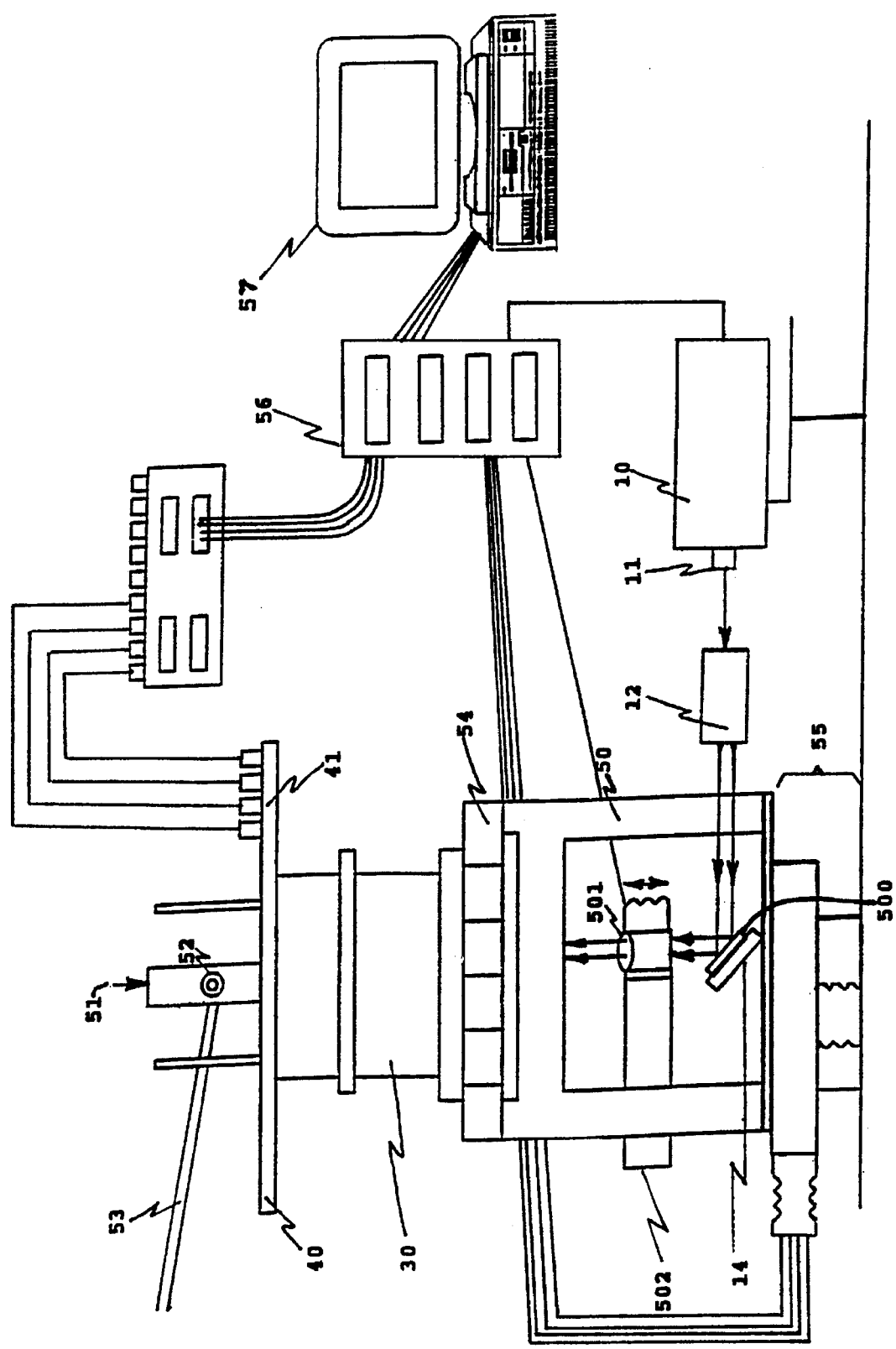
FIG. 5 is a front view of the infrared FPA crosstalk measurement system of the present invention.

FIG. 5 is a front view of the infrared FPA crosstalk measurement system of the present invention. The full dewar assembly, including main dewar body 30 with breakout modules 40 through 43 of FIG.4 with modules 40 and 41 shown in FIG. 5, is inserted downward into dewar support 50. The dewar which has been evacuated, is cooled during operation by either pressurized liquid nitrogen of helium supplied through a Heli-tran transfer line 51. Outlet 52 provides a coupling point for exit line 53 by which the coolant exits the dewar assembly after passing through the internal coldfinger. Slip ring 54 allows for coupling of the dewar assembly to dewar support 50 while also allowing for rotational adjustment. The dewar assembly and dewar support structure 50 is mounted on top of translational movement subassembly 55 which includes two Klinger translations stages. The translation stages are configured so that one of the stages controls the X-direction dewar translation and the other controls the Y-direction dewar translation. The translation stages are driven by precision stepper motors and can be positioned in 1 μm increments. This 1 μm resolution of the transnational movement subassembly 55 allows the system to scan the spot across detectors which can be as small as 25×25 μm.

The stepper motors are controlled via a IEEE-488 bus to a Klinger motor controller located within processor/controller 56 which includes a HP375 in the present embodiment. The motor controller will control the stepper motors which in turn will drive the translation stage to move the dewar to the required position. This Klinger controller/microprocessor is interfaced to a computer/work station 57 which in the present embodiment is an HP 9000 computer/work station. The HP 9000 computer station uses a high level computer language (Rocky Mountain Basic), which can be programmed to perform any hardware-related or analysis & measurement task. The FPA is controlled by the Klinger controller/microprocessor and its output is digitized via a Hi-Techniques A/D system, which is interfaced to the HP 9000 computer via an IEEE-488 bus.

The HP375 performs various functions including: automatic spot focusing, fast greyscale map generation with a "zoom" function, dewar alignment control, instrument control, data management as well as report generation via an output/input interface. The electronics needed to operate the FPA are provided from a Pulse Instruments PI-5800 pattern generator and PI-4000 series power supply systems. The signal conditioning and data conversion electronic are provided by a Hi-Techniques model IQ-300 Analog to Digital (A/D) converter system. The IQ-300 has eighteen independent input channels. Each input channel has a programmable gain and offset, ac or dc coupling, differential or single-ended inputs, 12 bit A/D conversion up to 10 MHz, at least 512 Kbytes of memory, and the capability to perform real-time signal averaging. The signal averaging capability effectively increase the resolution of the measurement allowing highly accurate background frame subtractions and signal measurements. The present invention results in the focussing of laser beams down to diffraction-limited, micron size diameters.

Laser 10 is a coherent radiation source utilized in the present invention with attached attenuator 58. Coherent sources which can be utilized in the present invention include: a 1.15 μm HeNe laser, a 3.39 μm HeNe laser, and a $CO_2$ laser tunable between 9.6 and 10.6 μm. The FPA under test will be used in a system with a well defined infrared (IR) passband, and that the FPA will be tested under conditions that closely resemble the actual operating conditions. The wavelength of the laser source used should fall within the spectral region defined by the passband of the system. The long wavelength infrared radiation (LWIR) source is a Line Lite model 950 water cooled tunable $CO_2$ laser. A water cooled laser was chosen to enhance the mode stability of the output. Attenuator 11 is used with the LWIR laser to reduce the output power from 9 watts to an acceptable level. A middle wavelength infrared radiation (MWIR) source used is a Spectra Physics model 127 HeNe tuned to the 3.39 μm wavelength, with a power output of 5 mW. The short wavelength (SWIR) source is a Spectra Physics HeNe laser model 1208, which lazes at 1.15 μm and has a power output of 25 mW.

The laser beam produced is expanded and collimated by collimator/expander 12 which utilizes a Galilean telescope design with diverging input lens and converging output lens. Collimator/expander 12 is designed to expand the diameter of the laser beam and collimate it by the following equation:

$$D_0/D_i = A_i/A_0 = f_0/f_i \quad [2]$$

where $D_0$ is the output beam diameter, $D_i$ is the input beam diameter, $A_i$ is the input beam divergence angle, $A_0$ is the output beam divergence angle, $f_0$ is the output lens focal length, and $f_i$ is the input lens focal length.

The output lens of expander/collimator 12 has negligible spherical aberrations (to the third order) and is corrected for very low wavefront distortion. With different lens configurations, the beam is expanded by factors of: 5×, 10×, or 20×.

The lens in expander/collimator 12 also has a broadband antireflection coating that provides approximately 0.25% reflectivity per surface over a broad spectral band.

The expanded and collimated beam is then reflected upwards by mirror 14 which in FIG. 5 is a flat 45 degree mirror with mirror surface 500 which is gold plated. The reflected beam is then focused by focusing lens 501 onto the detector element of the FPA. Lens 501 should closely match the F/# and optical passband of the dewar assembly. A lens translation subassembly 502 allows for the Z-direction translation of the focusing lens 501 so that the focus is fixed before scanning occurs. The most limiting factor in the optical components of the present invention is focusing lens 501. The fundamental contributors to the focussed laser spot are diffraction and spherical aberration. Spot size broading due to diffraction can be primarily reduced by decreasing the F/#, which practicably means an increase in lens diameter, while spherical aberration will grow sharply with an increase in lens diameter. Spherical aberrations must be eliminated to achieve minimally small spot diameters. Two possibilities exist for correction of spherical aberrations; using an aspheric corrector or aspheric lens surface, or (as in the present invention) canceling out the spherical aberrations by using a doublet lens element configured so that the spherical aberrations of the first element is effectively canceled out by the second.

In the present embodiment after the focal plane array (FPA) under test is powered up and made fully operational, the laser source is powered up and running so that the scanning technique of the present invention is initiated. The stepper motors for positioning the FPA are manually activated to position the detectors in reasonable proximity to the optimum focal point of the laser beam. The program stores the digitized output of each detector into a matrix, designated by:

$(x_r, y_r, z_r)$ where the r in $(x_r, y_r, z_r)$ denotes the rth measurement of the entire detector array and the scaler array element is the mnth detector output value.

The scaler values of $x_r$, $y_r$ & $z_r$ denote the position of the stepper motors at the time the measurement was taken. It should be pointed out that although the storage of an mn array might look formidable, especially if m & n are large, in practice, a large percentage of the detector elements will yield a value of zero for an output, because the laser probe beam diameter is only a tiny fractional size of the FPA dimensions; therefore many elements of the array don't see the beam. The position of the FPA and all of its detector outputs at that position can therefore be stored by the computer as an (m+1)(n+1) dimensional array, as illustrated above.

The computer program then steps the FPA a predetermined distance d, in the x-direction only. The distance d is dependent on the size of the detectors and for small detectors (less than 25 m) this increment might be as small as lom. Repeat the original operation of measuring and storing all of the detector outputs for a new position of the FPA. This new array differs from the previous array in that the x position has been displaced some constant distance d, such that $x_s = x_r + d$. Therefore, $(x_s, y_r, z_r)$, represents the new array, whose detector outputs will, in general, not be the same as previously because the FPA was moved from $x_r$ to $x_s$. The computer program then continues to measure and store additional arrays, each incremented in x by the same fixed amount d, until the entire FPA is scanned in the x direction. Upon completion of this operation, the program returns the FPA to the original xyz position, which can be taken as (0, O, O) without loss of generality.

Now, the computer program increments the y position of the stepper motors by the same distance d, and then repeats the entire scan, measure & storage sequence in the x-direction as before, except that now y=d & z=O. When the x scan is over, y is again incremented by d and the x position is again reset to zero. This sequence is summarized as follows: The initial position of the FPA is set to the origin of coordinates at (0, O, O) and the sequence of measurements is as follows:

(0, O, 0), (d, O, 0), (2d, O, 0), . . . (Nd, O, 0)

where N=W/d with W being the physical width of the FPA in the x direction.

Continuing the process by incrementing y, yields:

(0, d, 0), (d, d, 0), (2d, d, 0), . . . (Nd, d, 0), (0, 2d, 0), . . . (Nd, 2d, 0), . . . (0, Md, 0), . . . (Nd, Md, 0), where M=V/d with V being the vertical height of the FPA in the y direction.

Finally, the process concludes with the incrementing of the z position: Starting with: (0, O, d), . . . (Nd, O, d), . . . (0, d, d), . . . (Nd, d, d), . . . (0, Md, d), . . . (Nd, Md, d), . . . (0, 0, Pd), . . . (Nd, O, Pd), . . . (0, Md, Pd), . . . (Nd, Md, Pd), where P=Z/d with Z being the distance to sweep through focus in the z-direction.

Let us consider a typical case of an FPA of physical dimensions W=2.54 cm, V=2.54 cm and we wish to sweep a distance of Z=2.54 cm through the prospective focus. This will be referred to as a fast response scan with a scan increment of lorn (d=lorn). Let us also assume that this array consists of 128×128 elements. Therefore, N=2540 points, M=2540 points and P=2540 points. Therefore, each array $(x_r, y_r, z_r)$, consists of $(128+1)^2$ elements, 16,384 detector outputs, 3 position coordinates and 254 zeros. This results in $1.6384 \times 10^{10}$ arrays. (The total number of data point will be: $[1.6384 \times 10^{10}] \times [1.6641 \times 10^4] = 2.7265 \times 10^{14}$).

As was pointed out earlier, most of these points will consist of zeros, since pixels slightly removed from the laser probe beam will register a zero output. The computer language used with the HP-9000 (Rocky Mountain Basic) is specialized for matrix (array) operations and can store and manipulate very large data arrays by utilizing extensive matrix data compression algorithms involving zeros and so the apparently large size of the data set will, in actuality, be considerably smaller. Moreover, Rocky Mountain (RM) Basic also contains high-level function commands like "MIN" & "MAX," which are library routines that operate on any size array to determine its minimum or maximum values, respectively. RM Basic can apply the MAX function to all of the $1.6384 \times 10^{10}$ arrays to automatically yield an optimal focus in the z-direction to within the resolution of the scan increment. To double check that this is the optimal focus, plot out the response profile of a subset of detector outputs close to the detector output yielding the MAX value. At the assumed focal point in the z-position, a full width at half maximum response profile of these detector outputs should yield minimum values, as compared to all other subsets.

Once the optimal focal point is known, use the Klinger stepper motors to move the FPA to this z position. The next step of the process is to perform a fine resolution (d=im) scan of the entire FPA in the xy-plane. Proceed exactly as before, measuring, digitizing & storing the detector outputs while incrementing the stepper motors in intervals of im (d'=im). Store the response in an array as follows:

(x, y)

where (x, y) represents the position of the stepper motors in the xy-plane. The number of data points in each of these arrays is: $(128+1)2=16,641$.

Continuing with our typical case of the FPA with physical dimensions W=2.54 cm, V=2.54 cm, the values for N'=W/d'=25,400 points & M'=V/d'=25,400 points. The total number of arrays to store and process will be:

$$(25,400) 2=6.45 \times 108$$

The result of the above described scanning technique of the present invention is a set of 645,160,000 arrays comprising the complete responsivity map of all the detector outputs for the entire FPA. Applying the MAX function to this set of arrays will determine the maximum response of each detector. This max value will correlate to a position (x, y). This position corresponds to the location where the laser beam is directly focused on the center of the detector. Each detector in the FPA will be locatable by its own unique (x, y) position. Thereby moving the stepper motors to any of these xy-positions and there yields a measure the output response of "adjacent" detector outputs. Any nonzero responses are thus directly attributable to crosstalk between detector elements.

While this invention has been described in terms of preferred embodiment consisting of the system described above, those skilled in the art will recognize that the invention can be practiced with modification within the spirit and scope of the appended claims.

Having thus described my invention, what we claim as new and desire to secure by Letters Patent is as follows:

1. An automated test system for an infrared focal plane detector array where said array is cooled and means for providing a laser beam is adjustably mounted and optically aligned with said array, both mounted on a stable optical platform, whereby when said array is activated and exposed to said means for providing a laser beam there results output signals which are sampled by a means for sampling and stored in means for storing in at least one sample format, resulting in obtaining individual detector characteristics and overall statistical data about said detector array, the improvement including:

means for X-Y directional translation of the cooled array capable of approximately one micrometer positional increments;

means for the expansion and collimation of the laser beam for formation of a laser beam spot;

means for focusing the expanded and collimated laser beam spot onto individual detector elements of the array;

means for controlling the X-Y positioning of detector elements relative to said focused spot, coupled to both said means for X-Y directional translation and said means for expansion and collimation, such that a detector element output for each individual detector element is output;

means for processing the detector element outputs for the entire infrared focal plane array, coupled to the means for controlling the X-Y positioning of detector elements relative to said focused spot, such that crosstalk between detector elements are measured.

2. A technique for the evaluation and characterization of infrared focal plane detector arrays, wherein there is provided an array that is cooled, and provision for at least one laser source adjustably mounted and optically aligned with said array, both mounted on a stable optical platform, whereby when said array is activated and exposed to a laser beam, there results output signals which are sampled and stored in at least one sample format, thus obtaining individual detector characteristics and overall statistical data about said detector array, the improvement including the steps of:

providing X-Y directional translation of the cooled array capable of approximately one micrometer positional increments;

expanding and collimating the laser beam for formation of a laser beam spot;

focusing the expanded and collimated laser beam spot onto individual detector elements of the array;

controlling the X-Y positioning of detector elements relative to said focused spot, such that a detector element output for each individual detector element is output;

processing the detector element outputs for the entire infrared focal plane array, such that crosstalk between detector elements are measured.

* * * * *